(12) United States Patent
Hao

(10) Patent No.: US 11,435,403 B2
(45) Date of Patent: Sep. 6, 2022

(54) DETERMINING THE SIZE OF A CAPACITOR BANK

(71) Applicant: Schweitzer Engineering Laboratories, Inc., Pullman, WA (US)

(72) Inventor: Kei Hao, Anaheim, CA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 330 days.

(21) Appl. No.: 16/576,349

(22) Filed: Sep. 19, 2019

(65) Prior Publication Data

US 2021/0088595 A1 Mar. 25, 2021

(51) Int. Cl.
*G01R 31/385* (2019.01)
*G01R 27/26* (2006.01)
*G01R 31/367* (2019.01)

(52) U.S. Cl.
CPC ....... *G01R 31/385* (2019.01); *G01R 27/2605* (2013.01); *G01R 31/367* (2019.01)

(58) Field of Classification Search
None
See application file for complete search history.

(56) References Cited

U.S. PATENT DOCUMENTS

| | | |
|---|---|---|
| 4,689,752 A | 8/1987 | Fernandes |
| 4,709,339 A | 11/1987 | Fernandes |
| 4,794,328 A | 12/1988 | Fernandes |
| 5,168,414 A | 12/1992 | Horstmann |
| 5,220,311 A | 6/1993 | Schweitzer |
| 5,420,502 A | 5/1995 | Schweitzer |
| 5,550,476 A | 8/1996 | Lau |
| 5,565,783 A | 10/1996 | Lau |
| 5,656,931 A | 8/1997 | Lau |
| 5,670,864 A * | 9/1997 | Marx ............... G05F 1/70 323/210 |
| 6,002,260 A | 12/1999 | Lau |
| 6,014,301 A | 1/2000 | Schweitzer |
| 6,016,105 A | 1/2000 | Schweitzer |
| 6,133,723 A | 10/2000 | Feight |
| 6,133,724 A | 10/2000 | Schweitzer |
| 6,429,661 B1 | 8/2002 | Schweitzer |
| 6,433,698 B1 | 8/2002 | Schweitzer |
| 6,479,981 B2 | 11/2002 | Schweitzer |
| 6,734,662 B1 | 5/2004 | Fenske |
| 6,822,576 B1 | 11/2004 | Feight |
| 6,894,478 B1 | 5/2005 | Fenske |
| 6,949,921 B1 | 9/2005 | Feight |
| 6,963,197 B1 | 11/2005 | Feight |
| 7,053,601 B1 | 5/2006 | Fenske |
| 7,106,048 B1 | 9/2006 | Feight |
| 7,271,580 B1 | 9/2007 | Fenske |
| 7,315,169 B1 | 1/2008 | Fenske |

(Continued)

*Primary Examiner* — Nasima Monsur
(74) *Attorney, Agent, or Firm* — Bradley W. Schield; Richard M. Edge

(57) ABSTRACT

A capacitor bank controller may obtain voltage and current measurements while the capacitor bank is disconnected from the power line. Further, the capacitor bank controller may obtain voltage and current measurements while the capacitor bank is connected to the power line. The capacitor bank controller may determine the size of the capacitor bank based on impedances from the voltage and current measurements while the capacitor bank is connected and disconnected.

15 Claims, 4 Drawing Sheets

(56) References Cited

U.S. PATENT DOCUMENTS

| | | |
|---|---|---|
| 7,382,272 B2 | 6/2008 | Feight |
| 7,725,295 B2 | 5/2010 | Stoupi |
| 8,059,006 B2 | 11/2011 | Schweitzer |
| 8,575,941 B2 | 11/2013 | Samineni |
| 8,650,411 B2 | 2/2014 | Feight |
| 8,665,102 B2 | 3/2014 | Salewske |
| 10,419,064 B2 | 9/2019 | Cosic |
| 2008/0077336 A1 | 3/2008 | Fernandes |
| 2010/0013632 A1 | 1/2010 | Salewske |
| 2013/0128393 A1* | 5/2013 | Gajic ................ H02H 7/16 |
| | | 361/15 |
| 2015/0145536 A1* | 5/2015 | Kuenen .............. G01B 7/00 |
| | | 324/681 |
| 2016/0196526 A1* | 7/2016 | Khalid ............. A47F 5/0869 |
| | | 705/28 |

\* cited by examiner

DETERMINING THE SIZE OF A CAPACITOR BANK

TECHNICAL FIELD

The present disclosure relates generally to capacitor bank control and, more particularly, to automatically learning the size of a capacitor bank.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

Figure 1:
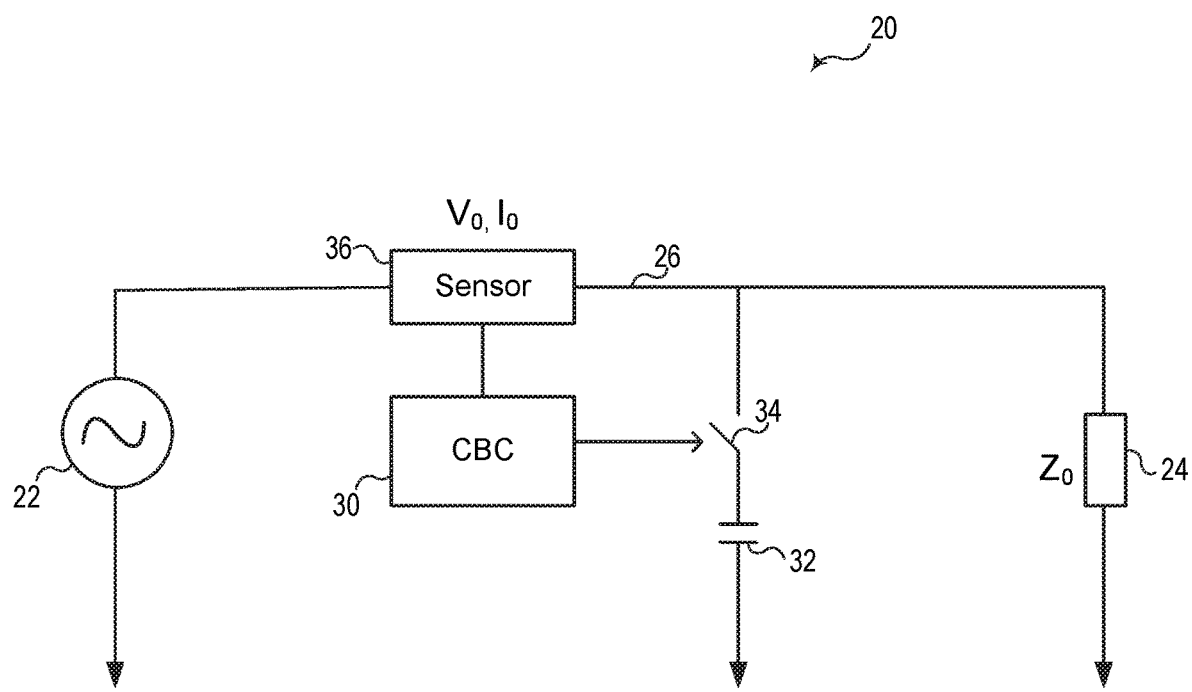
FIG. 1 is a circuit diagram of a power system that has capacitor bank controller (CBC) that controls a capacitor bank to be disconnected from the power system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, transformers, and the like, to provide electrical energy from a source to one or more loads. Various intelligent electronic devices (IEDs) may be used in monitoring and control of the power delivery system. For example, capacitor bank controllers (CBCs) may control capacitor banks in the power delivery system to control delivery of reactive power. To perform control operations, the CBC may receive voltage measurements and current measurements of a power line. Depending on the voltage and current on the power line, the CBC may send signal(s) to connect or disconnect the capacitor bank to improve the quality of power being delivered. For instance, the CBC may provide for power factor correction, kilovolt-ampere reactive (kVAR) support, or voltage improvement.

During commissioning, an operator may input various settings into the capacitor bank controller. For example, the operator may enter the size of the capacitor bank that the CBC is controlling. However, these inputs may be cumbersome resulting in longer installation times. Further, the operator may be unaware of the size of the capacitor bank, or the operator may input the incorrect size into the CBC. To reduce the settings input by an operator of the CBC, as explained below, the CBC may automatically determine the size of the capacitor bank based on voltage and current measurements while the capacitor bank is connector and disconnected. For example, a CBC may receive a first voltage measurement and a first current measurement while the capacitor bank is disconnected from a power system. The CBC may receive a second voltage measurement and a second current measurement while the capacitor bank is connected to the power system. The CBC may then determine the size of the capacitor bank based at least in part on the first voltage measurement, the first current measurement, the second voltage measurement, and the second current measurement. For example, the CBC may use the impedance from the voltage and current measurements detected by the CBC while the capacitor bank is connected and the impedance from the voltage and current measurements detected by the CBC while the capacitor bank is disconnected to determine the capacitor bank size in VARs.

FIG. 1 illustrates a circuit diagram of an embodiment of an electric power delivery system 20, which may have various electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the electric power delivery system 20 includes a power source 22 and a load 24. The electric power delivery system 20 includes a power line 26 that is communicatively coupled between the power source 22 and the load 24 to deliver power from the power source 22 to the load 24.

The electric power delivery system 20 may be monitored by capacitor bank controller (CBC) 30 that controls a capacitor bank 32 by sending signals to a switch 34 to electrically connect or disconnect the capacitor bank 32 from the power line 26. While illustrated as a single capacitor, note that several capacitors may be used and the particular size of the capacitor bank may depend on the application.

The CBC 30 may obtain electric power system information using one or more sensors. For example, line post sensors 36 may be mounted on a power line or other structure of the power line post to monitor the current and/or voltage of the power line 26. Line post sensors 36 may include current transformers that provide a signal indicating current on the power line 26 and/or potential transformers that provide a signal indicating voltage on the power line 26. While line post sensors are used as an example, any suitable sensor may be used to obtain voltage and current measurements of the power line. Although illustrated in single-line form for purposes of simplicity, the electric power delivery system 20 may be a multi-phase system, such as a three-phase electric power delivery system.

As illustrated, the CBC 30 may obtain a first voltage measurement ($V_0$) and a first current measurement ($I_0$) from the sensors 36 indicating the voltage and current of the power line 26 while the switching device 34 in a first state (e.g., open state) in which the capacitor bank 32 is electrically disconnected from the power line 26. A first equivalent load impedance $Z_0$ of the electric power delivery system 20 may be determined as:

$$Z_0 = \frac{V_0}{I_0} \qquad \text{Eq. 1}$$

where $Z_0$ is the impedance from the V0 and I0 measurements detected by the CBC 30 without the capacitor bank connected. The CBC 30 may obtain the $V_0$ and $I_0$ measurements immediately preceding closing the switching device 34. For example, the measurements may be obtained within a portion of a cycle ($\frac{1}{8}^{th}$, $\frac{1}{16}^{th}$, $\frac{1}{32}^{nd}$, $\frac{1}{64}^{th}$, etc. of a cycle) from closing the switching device 34.

Figure 2:
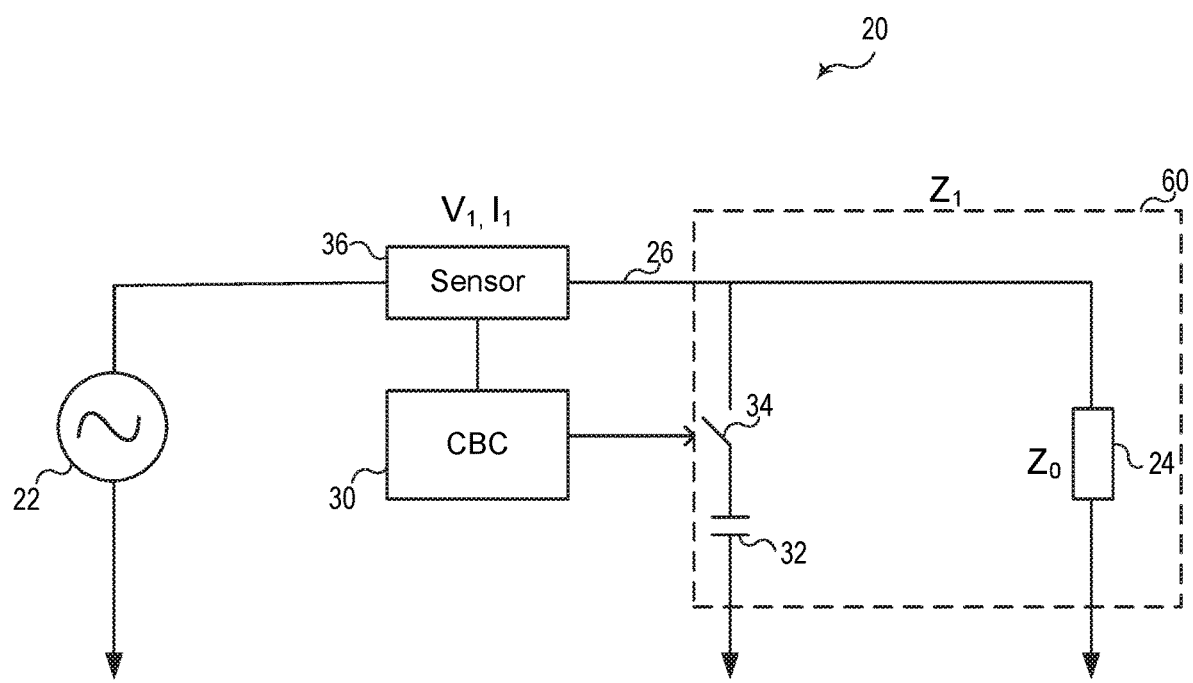
FIG. 2 is a circuit diagram of the power system of FIG. 1 in which the CBC has connected the capacitor bank to the power system, in accordance with an embodiment.

FIG. 2 illustrates a circuit diagram of the electric power delivery system 20 of FIG. 1 with the switching device 34 in a second state (e.g., closed state). Upon closing the switching device 34, the CBC 30 may obtain a second voltage measurement ($V_1$) and a second current measurement ($I_1$) from the sensors 36 indicating the voltage and current of the power line 26 while the switching device is in the second state in which the capacitor bank 32 is electrically connected to the power line 26. A second equivalent load impedance ($Z_1$) of the electric power system 20 may be determined as:

$$Z_1 = \frac{V_1}{I_1} \qquad \text{Eq. 2}$$

where $Z_1$ represents the combined load impedance of the capacitor bank and the equivalent load impedance $Z_0$, which may be given by the equation:

$$Z_1 = \frac{Z_0 Z_C}{(Z_0 + Z_C)} \qquad \text{Eq. 3}$$

where $Z_0$ is the first equivalent load impedance of the loads on the power line 26 without the capacitor bank and $Z_C$ is the capacitor bank load impedance. Solving for $Z_C$:

$$Z_C = \frac{Z_0 Z_1}{(Z_0 - Z_1)} \qquad \text{Eq. 4}$$

The capacitor bank may be sized according to the volt-ampere reactive (VARs) provided by the capacitor bank. As such, the CBC capacitor bank size (Q) may be given by:

$$Q = \frac{V_1^2}{\text{Im}(Z_C)} \qquad \text{Eq. 5}$$

Where $V_1$ is the voltage measurement while the capacitor bank is electrically connected and Im is a function that takes the imaginary part of the capacitor bank load impedance.

The CBC 30 may obtain the $V_1$ and $I_1$ measurements immediately following closing of the switching device 34. For example, the measurements may be obtained within $\frac{1}{8}^{th}$, $\frac{1}{16}^{th}$, $\frac{1}{32}^{nd}$, or the like, of a cycle following closing of the switching device 34. By obtaining the $V_0$ and $I_0$ measurements immediately preceding closing the switching device 34 and obtaining $V_1$ and $I_1$ measurements immediately following closing the switching device 34, the CBC 30 may obtain measurements proximate in time such that the load 24 may remain approximately constant for each of the measurements. In other embodiments, the phasor information of the current prior to the closing and following the closing of the switching device 34 may be used for point-on-the-waveform analysis to account for the time delay in operating the switching device 34.

Figure 3:
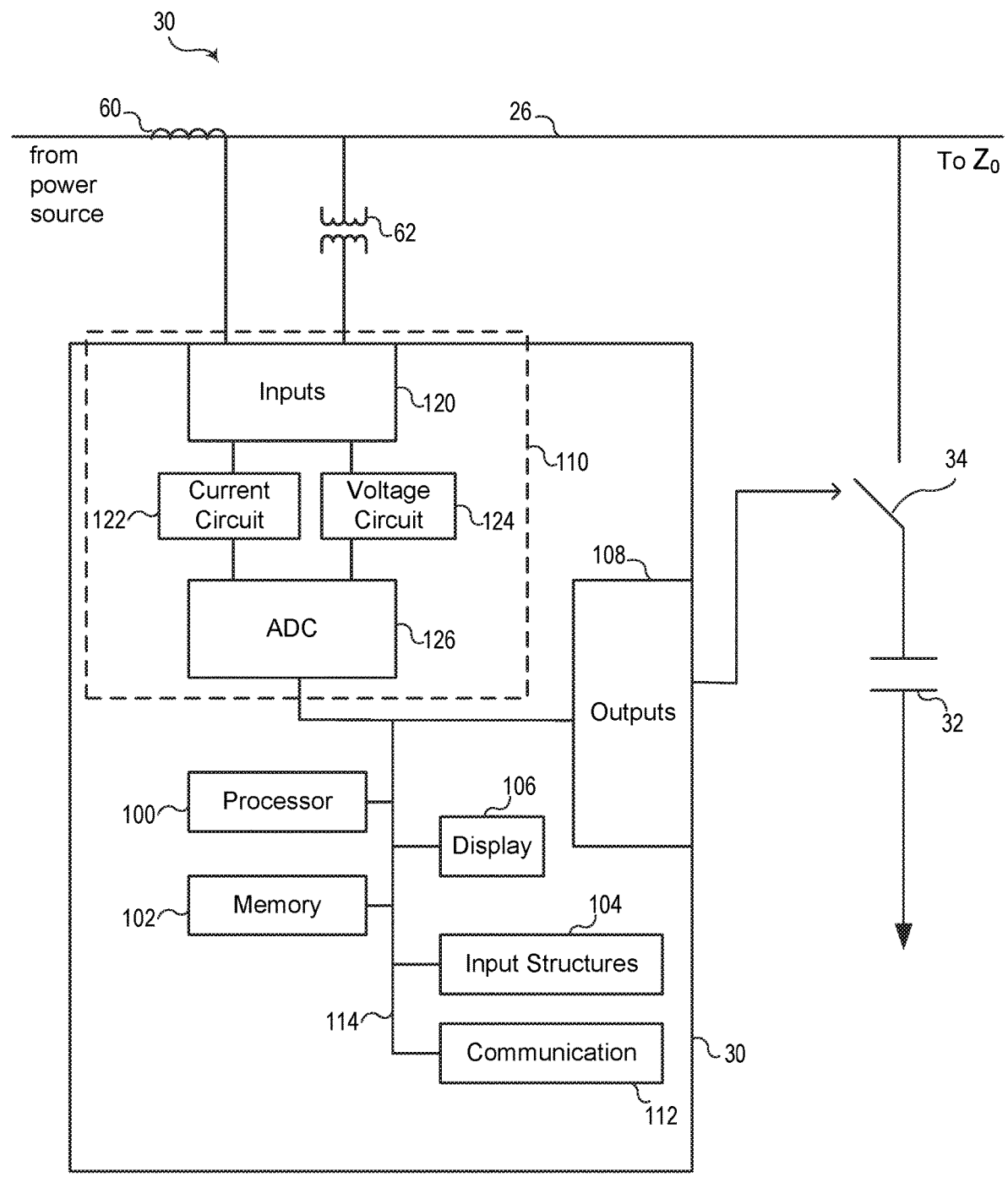
FIG. 3 is a block diagram of the CBC of FIG. 1, in accordance with an embodiment.

FIG. 3 is an embodiment of a block diagram of a CBC 30 that uses voltage measurements and current measurements to determine the size of a capacitor bank. As illustrated, the CBC 30 is communicatively coupled to a current sensor 60, such as a current transformer (CT) to obtain current measurements of the power line 26. Further, the CBC 30 may be communicatively coupled to a potential transformer (PT) to obtain voltage measurements of the power line. While illustrated as separate sensors, in some embodiments, as mentioned above, a combination line post sensor that detects both current and voltage of the power line may be used or any other suitable current and voltage sensor.

In the illustrated embodiment, the CBC 30 includes a processor 100, a computer-readable storage medium 102, input structures 104, a display 106, output circuitry 108, sensor circuitry 110, and communication circuitry 112. The CBC 30 may include one or more bus(es) 114 connecting the processor 100 or processing unit(s) to the computer-readable storage medium 102, the input structures 104, the display 106, the output circuitry 108, sensor circuitry 110, and/or the communication circuitry 112. The computer-readable storage medium 102 be embodied as memory, such as random access memory (RAM), read only memory (ROM), or a combination thereof, and may include or interface with software, hardware, or firmware modules for implementing various portions of the systems and methods described herein. The computer-readable storage medium 102 may be the repository of one or more modules and/or executable instructions configured to implement any of the processes described herein.

The processor 100 may process inputs received via the sensor circuitry 110 and the communication circuitry 112. The processor 100 may operate using any number of processing rates and architectures. The processor 100 may be configured to perform various algorithms and calculations described herein using computer executable instructions stored on computer-readable storage medium 102. The processor 100 may be embodied as a microprocessor. In certain embodiments, the processor 100 and/or the computer-readable storage medium 102 may be embodied as discrete electrical components, a general purpose integrated circuit, one or more Application Specific Integrated Circuits ("ASICs"), a Field Programmable Gate Array ("FPGA"), and/or other programmable logic devices. The processor 100 and/or the computer-readable storage medium 102 may be referred to generally as processing circuitry.

As illustrated, the sensor circuitry 110 may include, for example, input pins 120 or connectors that receive current signals(s) and voltage signal(s) from the current sensor 60 and the voltage sensor 62. The sensor circuitry 110 may transform the current and voltage signals using an internal current circuit 122 and an internal voltage circuit 124 to a level that may be measured (e.g., via internal transformers), and sample the signals using, for example, A/D converter(s) 126 to produce digital signals representative of measured voltage and measured current on the power line 26 The A/D converter 126 may be connected to the processor 100 by way of the bus 114, through which digitized representations of voltage signals may be transmitted to the processor 100.

The communication circuitry 112 may include communication ports, such as ethernet and serial ports. In some embodiments, the CBC 30 may remotely control switches of the capacitor banks using by communicating using the ethernet or serial ports. The CBC 30 may include a display screen 106 that displays information to notify an operator of operating parameters of the electric power delivery system 20, such as current measurements, voltage measurements, capacitor bank status, power flow direction, etc. The input structures 104 may include buttons, controls, universal serial bus (USB) ports, or the like, to allow a user to provide input settings to the CBC 30. In some embodiments, the display 106 may be a touchscreen display.

The output circuitry 108 may include one or more output pins or connectors that electrically connect the CBC 30 to the switching device 34 to allow the processor 100 to send control signals to the switching device 34 to control connection or disconnection of the capacitor bank 32 to the power line 26.

The CBC 30 may be communicatively coupled to the switching device(s) 34 to send signal(s) to the switching device(s) 34 to electrically connect the capacitor bank 32 to or disconnect the capacitor bank 32 from the power line 26. The switching device 34 may be any suitable switching device or combination of devices that connect or disconnect the capacitor bank 32, such as metal-oxide-semiconductor field-effect transistors (MOSFETs), relays, switches, etc. While illustrated as a single phase of a power system 20, the switching device 34 may include individual switching devices for each phase of the power line 26 to control connecting/disconnecting each phase separately or may include a ganged switching device that connects/disconnects each of the phases together.

Figure 4:
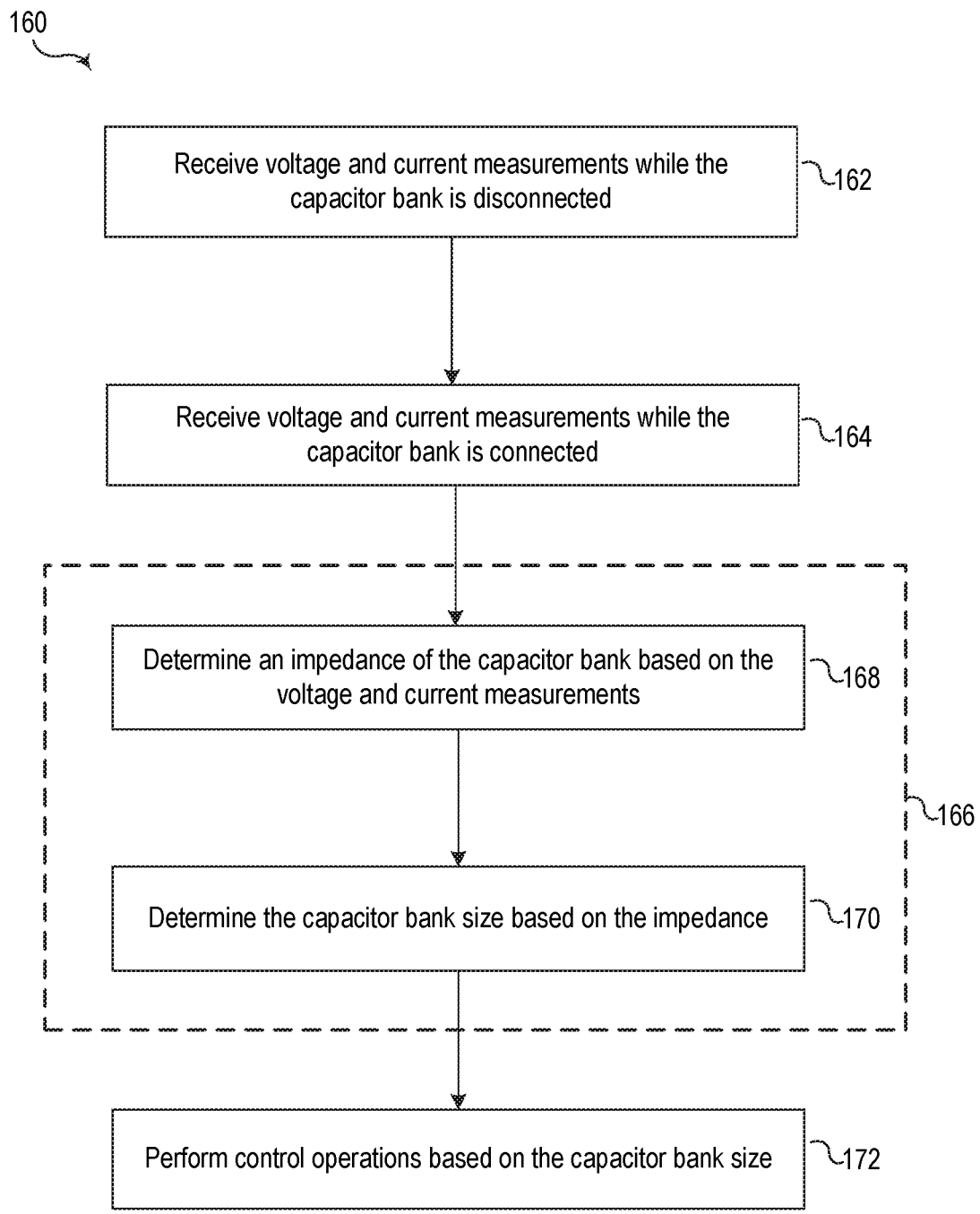
FIG. 4 is a flow diagram of a process performed by the CBC of FIG. 1, in accordance with an embodiment.

FIG. 4 is a flowchart of a process 160 that may be performed by the CBC 30 to determine the size of the capacitor bank 32. The process 160 may be stored as instructions on the memory 102 to be executed as instructions (e.g., code) by the processor 100. The process 160 may include receiving a first voltage measurement (e.g., $V_0$) and a first current measurement (e.g., $I_0$) while the capacitor bank is disconnected (block 162). The process 160 may continue by closing the switching device 34 to connect the capacitor bank 30.

The processor 100 may obtain a second voltage measurement (e.g., $V_1$) and a second current measurement (e.g., $I_1$) while the capacitor bank is connected (block 164). While the steps shown in FIG. 4 are performed as obtaining measurements with the capacitor bank disconnected first, the order is simply meant to be illustrative, and the CBC may obtain the voltage and current measurements with the capacitor bank connected first.

The processor 100 may determine the size of the capacitor bank 32 based on the current measurement and voltage measurement with the capacitor bank disconnected and the current measurement and voltage measurement with the capacitor bank connected (block 166). In the illustrated embodiment, the processor 100 may calculate a capacitor bank impedance $Z_C$ using equations 1-4 as described above or a combination thereof (block 168).

The processor 100 may then determine the size of the capacitor bank based on the impedance (block 170). For instance, the processor 100 may calculate an estimated size using equation 5. In certain embodiments, multiple VAR values may be calculated using equation 5 after taking multiple voltage and current measurements. The VAR values may be averaged as:

$$Q = \frac{\sum_{i=1}^{N} Q_i}{N} \qquad \text{Eq. 6}$$

where Q is the average of the VAR values, $Q_i$ is the $i^{th}$ VAR calculation of N VAR calculations using the $i^{th}$ set of voltage and current measurements from opening and closing the switching device 34.

In some embodiments, the computer-readable medium 102 may include a set of standard values of capacitor bank sizes in a look-up table of standard values. The processor 100 may select, from the look-up table, the closest standard capacitor size to the estimated size determined using equation 5 or the averaged value from equation 6. For example, each standard size may be associated with a range of sizes. The processor 100 may select the standard size associated with the range of sizes in which the estimated size falls within.

The CBC 30 may provide, via the display 106, a prompt to an operator indicating the determined capacitor bank size to allow the operator to confirm the size of the capacitor bank. In other embodiments, the CBC 30 may simply set the capacitor bank size based on the calculations.

The CBC 30 may then perform control operations based on the capacitor bank size. For example, the CBC 30 may perform VAR control, PF control, voltage control, current control, or any combination thereof on each of the phases of the power system. The CBC 30 may control the VARs on the power line by using the VARs that the capacitor bank is estimated to add or remove from operating the switching device.

Although the above embodiments have been described with respect to a phase of a power line, the above process may be performed using multi-phase (e.g., three phase) measurements to determine the size of the capacitor bank. For example, voltage and current sensors may be included on each phase of the power line. Further, the CBC 30 may use equations 1-5 to compute impedances of each of the phases (e.g., A-C) without the capacitor bank connected (e.g., $Z_{0,A}$, $Z_{0,B}$, $Z_{0,C}$, $Z_{1,A}$, $Z_{1,B}$, $Z_{1,C}$, $Z_{C,A}$, $Z_{C,B}$, $Z_{C,C}$, and $Q_A$, $Q_B$, $Q_C$, where the added A, B, and C indicate the phase of the three-phase system. In such an example, the CBC 30 may determine the capacitor bank size to be $$Q = \frac{Q_A + Q_B + Q_C}{3} \qquad \text{Eq. 7}$$

The capacitor bank size may be determined as Q of equation 7 or using equation 7 as a sample of an average of multiple measurements.

By automatically determining the size of the capacitor bank based on the voltage measurements and current measurements of the power line, the CBC may have fewer settings to be input during commissioning. Further, fewer settings may result in a faster or more efficient commissioning or may result in fewer operator errors in the commissioning process.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A capacitor bank controller (CBC), comprising:
sensor circuitry in communication with a current sensor and a voltage sensor;
memory; and
a processor operatively coupled to the memory, wherein the processor is configured to:
obtain a first voltage measurement and a first current measurement using the sensor circuitry while a capacitor bank is disconnected from a power system;
obtain a second voltage measurement ($V_1$) and a second current measurement using the sensor circuitry while the capacitor bank is connected to the power system;
calculate a disconnected impedance ($Z_0$) from the first voltage measurement and the first current measurement;
calculate a connected impedance ($Z_1$) from the second voltage measurement and the second current measurement;
calculate a capacitor bank impedance ($Z_C$) as:

$$Z_C = \frac{Z_0 Z_1}{(Z_0 - Z_1)}$$

calculate a size of the capacitor bank (Q) as:

$$Q = \frac{V_1^2}{\text{Im}(Z_C)}$$

and control an operation of the capacitor bank by sending signals to a switch to electrically connect or disconnect the capacitor bank from the power system based at least in part on the size of the capacitor bank.

2. The CBC of claim 1, wherein the processor is configured to:
determine the disconnected impedance while the capacitor bank is disconnected by dividing the first voltage measurement by the first current measurement; and
determine the connected impedance of the capacitor bank by dividing the second voltage measurement by the second current measurement.

3. The CBC of claim 1, wherein the memory comprises a look-up table of standard capacitor bank sizes, wherein the processor is configured to select a standard capacitor bank size with a range in which the determined size of the capacitor bank falls within.

4. The CBC of claim 3, wherein the processor is configured to provide a prompt indicating the selected standard capacitor bank size to allow an operator to confirm the size of the capacitor bank.

5. The CBC of claim 1, wherein the processor is configured to determining the size of the capacitor bank based on an averaging of capacitor bank sizes from multiple sets of measurements, wherein a first set of measurements comprises the first voltage measurement, the first current measurement, the second voltage measurement, and the second current measurement.

6. The CBC of claim 1, wherein the processor is configured to send a signal to close or open the capacitor bank immediately between the first measurements and the second measurements to capture the first measurements and the second measurements proximate in time.

7. The CBC of claim 1, wherein the processor is configured to perform at least one of VAR control, PF control, voltage control, and current control as the control operation.

8. A tangible, non-transitory, computer-readable medium comprising instructions that, when executed by a processor, cause the processor to:
receive a first voltage measurement and a first current measurement from sensor circuitry in communication with voltage and current sensors, while a capacitor bank is disconnected from a power system;
receive a second voltage measurement ($V_1$) and a second current measurement from the sensor circuitry in communication with voltage and current sensors, while the capacitor bank is connected to the power system;
calculate a disconnected impedance ($Z_0$) from the first voltage measurement and the first current measurement;
calculate a connected impedance ($Z_1$) from the second voltage measurement and the second current measurement;
calculate a capacitor bank impedance ($Z_C$) as:

$$Z_C = \frac{Z_0 Z_1}{(Z_0 - Z_1)}$$

and calculate a size of the capacitor bank (Q) as:

$$Q = \frac{V_1^2}{\text{Im}(Z_C)}$$

and control an operation of the capacitor bank by sending signals to a switching device to electrically connect or disconnect the capacitor bank from the power system based at least in part on the size of the capacitor bank.

9. The tangible, non-transitory, computer-readable medium of claim 8, comprising instructions that cause the processor to:
receive the first voltage measurement and the first current measurement at a first time;
send a signal to control a switch of the capacitor bank at a second time, immediately following the first time; and
receive the second voltage measurement and the second current measurement at a third time, immediately following the second time.

10. The tangible, non-transitory, computer-readable medium of claim 8, wherein the control operation comprises at least one of VAR control, PF control, voltage control, and current control as the control operation.

11. The tangible, non-transitory, computer-readable medium of claim 8, comprising instructions that cause the processor to display a prompt indicating the size of the capacitor bank on a display of a capacitor bank controller.

12. A method comprising:
obtaining a first voltage measurement and a first current measurement from sensor circuitry in communication with voltage and current sensors, while a capacitor bank is disconnected from a power system;

obtaining a second voltage measurement ($V_1$) and a second current measurement from sensor circuitry in communication with voltage and current sensors, while the capacitor bank is connected to the power system;

calculating a disconnected impedance ($Z_0$) from the first voltage measurement and the first current measurement;

calculating a connected impedance ($Z_1$) from the second voltage measurement and the second current measurement;

calculating a capacitor bank impedance ($Z_C$) as:

$$Z_C = \frac{Z_0 Z_1}{(Z_0 - Z_1)}$$

calculating-a size of the capacitor bank (Q) as:

$$Q = \frac{V_1^2}{\text{Im}(Z_C)}$$

and controlling operation of the capacitor bank by sending signals to a switching device to electrically connect or disconnect the capacitor bank from the power system based at least in part on the size of the capacitor bank.

13. The method of claim 12, wherein controlling operation of the capacitor bank comprises sending one or more signals to the switching device of the capacitor bank to connect or disconnect the capacitor bank based at least in part on the electrical characteristics of the power system.

14. The method of claim 12, wherein the first measurements and the second measurements are obtained within ⅛th of a cycle of the power system.

15. The method of claim 12, wherein the first voltage measurement, the first current measurement, the second voltage measurement, and the second current measurement are measurements of a first phase of a power system, wherein additional measurements are taken of a second phase and a third phase, and wherein the method comprising determine the size of the capacitor bank based on the measurements of each of the first phase, the second phase, and the third phase.

* * * * *